United States Patent [19]
Faure et al.

[11] Patent Number: 5,538,151
[45] Date of Patent: Jul. 23, 1996

[54] RECOVERY OF AN ANODICALLY BONDED GLASS DEVICE FROM A SUSSTRATE BY USE OF A METAL INTERLAYER

[75] Inventors: Thomas B. Faure, Georgia; Kurt R. Kimmel, Jericho; Wilbur D. Pricer, Charlotte; Charles A. Whiting, Milton, all of Vt.

[73] Assignee: International Business Machines Corp., Armonk, N.Y.

[21] Appl. No.: 375,769

[22] Filed: Jan. 20, 1995

[51] Int. Cl.[6] .............................. H01L 21/00; B44C 1/22
[52] U.S. Cl. ........................ 216/2; 216/12; 216/36; 216/24; 216/67; 156/657.1
[58] Field of Search ........................... 216/2, 12, 24, 216/36, 67, 100; 156/631.1, 632.1, 643.1, 657.1

[56] References Cited

U.S. PATENT DOCUMENTS

| | | | |
|---|---|---|---|
| 4,994,139 | 2/1991 | Biermann et al. | 156/656.1 X |
| 5,023,156 | 6/1991 | Takeuchi et al. | 430/5 |
| 5,101,420 | 3/1992 | Kushibiki et al. | 378/35 |
| 5,154,797 | 10/1992 | Blomquist et al. | 216/12 |

*Primary Examiner*—William Powell
*Attorney, Agent, or Firm*—Heslin & Rothenberg

[57] ABSTRACT

A structure and method for removing and recovering an anodically bonded glass device from a substrate using a metal interlayer interposed between the glass and the substrate is provided. As used in semiconductor mask fabrication, the structure comprises a silicon wafer substrate coated with a membrane on which a metal interlayer is disposed. The metal interlayer and a glass device are anodically bonded together. Recovery of the glass device is accomplished by chemically and mechanically removing the wafer and its membrane from the metal interlayer. The membrane is preferably removed using reactive ion etching to which the metal interlayer is resistant. The metal interlayer is then removed from the glass device using a highly corrosive chemical solution. The recovered glass device may then be reused.

9 Claims, 2 Drawing Sheets

5,538,151

RECOVERY OF AN ANODICALLY BONDED GLASS DEVICE FROM A SUSSTRATE BY USE OF A METAL INTERLAYER

Technical Field

The present invention generally relates to a structure and method for recovering an anodically bonded glass device, and more particularly, to a structure and method for removing and recovering a glass device anodically bonded to a metal interlayer interposed between the glass and a substrate.

BACKGROUND OF THE INVENTION

X-ray masks used in semiconductor fabrication are typically manufactured by first forming a membrane on a silicon wafer, followed by anodic bonding of the coated wafer to a sodium-containing borosilicate glass ring for additional support and rigidity. However, the anodic bonding process is irreversible, and any masks or mask blanks that fail during processing are discarded without recovering the bonded glass support therefrom. Sodium-containing borosilicate glass is used for the support ring in the semiconductor mask industry because its thermal expansion coefficient closely matches that of silicon. It is also advantageous because of its high chemical resistance. However, the cost of sodium-containing borosilicate glass is an expensive component in the cost of the mask fabrication. Thus, discarding the glass increases the manufacturing cost of semiconductor masks.

Anodic bonding is a process for sealing certain easily oxidizable metals to certain glass devices in which no adhesive is necessary. Contact made between the materials at high temperatures and with electrical bias creates an irreversible hermetic seal between the materials. In addition to semiconductor mask manufacturing, anodic bonding is often used by other industries where a hermetic seal is required between appropriate metals and glasses. Examples of such applications include use in multipurpose sensors such as semiconductor pressure sensors, pressure transducers, acceleration sensors, and vibration sensors.

However, because neither reverse biasing nor cooling will break the anodic bond, no recovery of the glass is currently possible using available methods if the substrate to which it is bonded should fail during subsequent processing. Previous efforts directed toward the recovery of the glass support ring from semiconductor mask manufacture, for example, have been unsuccessful.

Mechanical polishing of the substrate surface to remove the substrate from the bonded glass device is generally unsuitable because such machining will also remove a portion of the glass. Similarly, strong acid or base solutions such as potassium hydroxide or hydrofluoric/nitric/acetic acid solutions used to remove the metal substrate will also damage the glass device. Generally, sodium-containing borosilicate glass, the glass commonly used in the semiconductor industry, recovered in this way cannot be remachined or polished for subsequent use due to thickness tolerances on the glass ring support.

A need therefore exists for a practical method and structure for the recovery of glass anodically bonded to a substrate without damaging the glass upon removal of the substrate from it. In particular, in the semiconductor mask manufacturing industry, a need exists for a structure and method which permits the reuse of the recovered sodium-containing borosilicate glass in manufacturing new masks.

Disclosure of the Invention

Briefly, in one aspect of the present invention, a structure is provided for facilitating the recovery of a glass device, preferably comprising a sodium-containing borosilicate glass, contained therein without damaging the glass device. The structure comprises a substrate having a metal interlayer interposed between it and the glass device. In a more specific embodiment, the substrate has a film on a surface thereof, and the metal interlayer is disposed on the film.

In another aspect, the present invention provides a method for the removal and recovery of an anodically bonded glass device, preferably sodium-containing borosilicate glass, from a metal interlayer on a substrate where the metal interlayer anodically bonds with the glass device. In a more specific embodiment, a film is interposed between the substrate surface and the metal interlayer. The method comprises mechanically or chemically removing the substrate, and the film where one is used, from the metal interlayer, followed by removing the metal interlayer from the glass device with a chemical solution which is corrosive to the metal interlayer but which does not damage the underlying glass device.

The metal interlayer is a layer of an easily oxidizable metal used to facilitate anodic bonding of the metal interlayer to the glass device. Preferably, the metal interlayer is resistant to selective reactive ion etching (RIE), thereby facilitating removal of a material that is etchable by RIE without removing the metal interlayer. An etch-rate ratio (ERR) of 2:1 or greater between the material and the metal interlayer is usually necessary. A typical ERR for silicon to chromium is 50:1 in sulfur hexafluoride chemistry. As used herein, the term "etchable by RIE" refers to being removable by etching at a rate typically greater than about 1000 Å/minute. The term "resistant to RIE" as used herein refers to being removable by etching at a rate typically about 500 Å/minute or less.

The glass device is generally susceptible to RIE damage, and the metal interlayer acts as an etch stop to prevent this damage to the glass device. In addition, the glass device is chemically inert to the otherwise corrosive chemical solutions used to react with and remove the metal interlayer from the glass. As used herein, the term "chemically inert" refers to being nonreactive with and left undamaged by corrosive chemical solutions. The term "corrosive" is used herein to refer to being capable of reacting with and removing by dissolution a material from another material without leaving a residue.

To restate, the present invention satisfies the need for a structure and method for removing and recovering an anodically bonded glass device from a substrate without damaging the glass device. It accomplishes this by introducing a removable metal interlayer between the glass and the substrate. For example, the present invention provides a structure and method for recovering the sodium-containing borosilicate glass support ring used in semiconductor mask fabrication which permits reuse of the recovered glass if the original mask fails during processing subsequent to bonding. Because the expensive glass support ring is a significant cost component in the final assembly of the semiconductor mask, and ring usage is substantial, an economic advantage to the semiconductor mask industry can be realized by practicing the present invention, which enables the glass to be reused if the mask is discarded.

In addition, the structure of the present invention is advantageous over current structures used in the fabrication of semiconductor masks because it permits use of a substrate that is not capable of anodic bonding to glass. Current mask structures comprise glass directly anodically bonded to silicon, silicon oxide, silicon carbide, or silicon nitride. However, a carbon (diamond) membrane layer on a silicon wafer does not anodically bond to glass, and a layer of silicon oxide is necessarily deposited onto the carbon (diamond) membrane to facilitate anodic bonding of the mask to glass. Using the structure of the present invention, wherein a metal interlayer is interposed between the substrate and the glass prior to anodic bonding, deposition of a silicon oxide coating onto the carbon (diamond) membrane is not necessary. Thus, any substrate that adheres to the metal interlayer can indirectly anodically bond to glass.

Particular applications in semiconductor mask fabrication in which the structure and method of the present invention may be used include, but are not limited to, ion-beam projection masks, electron-beam projection masks, X-ray masks, and Scattering with Angular Limitation Projection Electron Lithography (SCALPEL) masks (See J. A. Liddle & S. D. Berger, *SCALPEL Masks*, 14th Annual Bacus Symposium (Sept. 1994)). In addition, the structure and method of the present invention may be employed in micromachining applications such as sensor packaging and glass-encapsulated relays.

BEST MODE FOR CARRYING OUT THE INVENTION

As noted, the present invention provides a structure and method for removing and recovering an anodically bonded glass device from a substrate without damaging the glass device. In particular, an oxidizable metal interlayer is formed on the surface of the substrate, and the glass device is anodically bonded thereto. The substrate is mechanically or chemically removed from the metal interlayer without damaging the underlying glass device. The metal interlayer is then removed from the glass device using a corrosive chemical solution that reacts with the metal interlayer but does not attack the glass device, which is therefore available for subsequent use.

Figure 1:
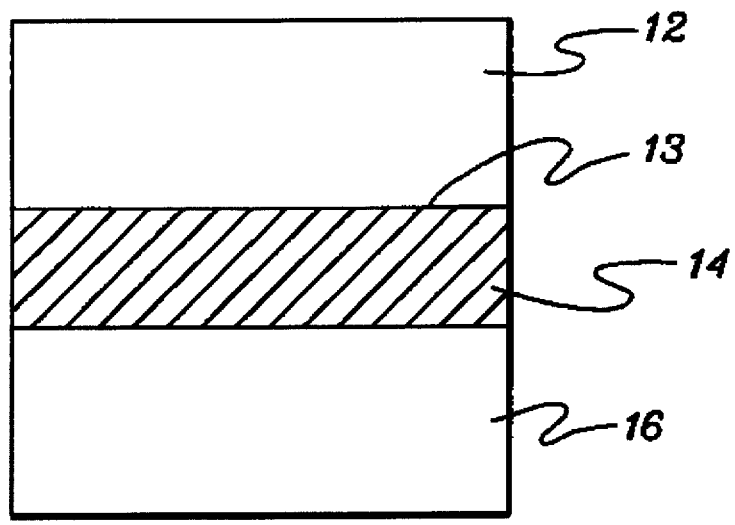
FIG. 1 is a cross section of an embodiment of the structure of the present invention.

As shown in FIG. 1, one embodiment of the structure of the present invention comprises a substrate 12 which has a surface 13 coated with an oxidizable metal interlayer 14 which is then anodically bonded to a glass device 16. Any substrate that will adhere to the particular metal interlayer may be used, and substrate need 12 not be capable of anodic bonding itself.

Figure 2:
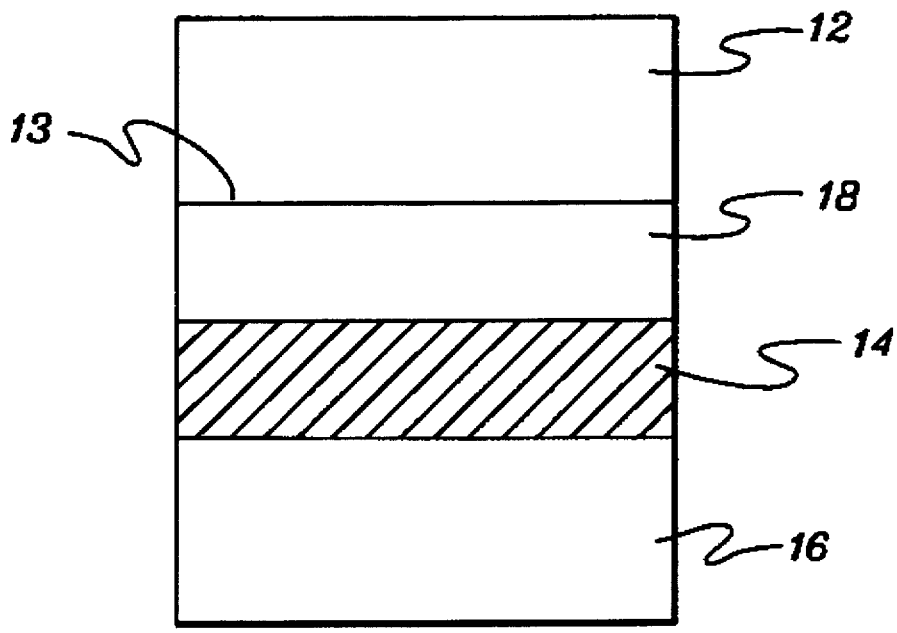
FIG. 2 is a cross section of a preferred embodiment of the structure of the present invention.
Figure 4:
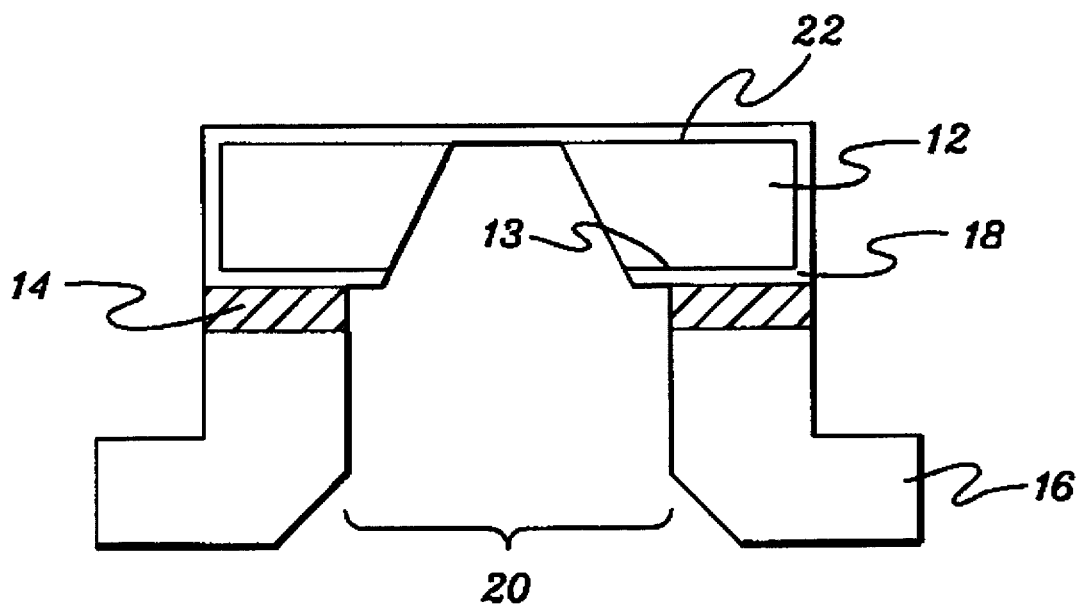
FIG. 4 is a cross section of an X-ray mask illustrating a preferred embodiment of the present invention.

In a preferred embodiment, as shown in FIG. 2, a film 18 is interposed between substrate 12 and metal interlayer 14. Film 18 is necessarily on at least the bottom surface 13 of substrate 12, and is coated with oxidizable metal interlayer 14 which is anodically bonded to glass device 16. For example, a cross section of the preferred embodiment of the structure in semiconductor X-ray mask fabrication is shown in FIG. 4 where substrate 12 is typically a silicon semiconductor wafer having a film 18 comprising a membrane material on the entire wafer substrate surface including both the top surface 22 and bottom surface 13 of wafer substrate 12. In X-ray mask manufacturing, membrane material film 18 is an X-ray permeable, chemically durable membrane layer such as boron-doped silicon, silicon carbide, silicon nitride, carbon (diamond), boron nitride, beryllium, and polysilicon. In other applications, such as in ion-beam projection masks and electron-beam projection masks, the membrane material used to form film 18 may be permeable or opaque to electrons, or opaque to ions. Use of the term "opaque" herein refers to blocking the passage of particles such as ions or electrons through the membrane material.

Figure 3:
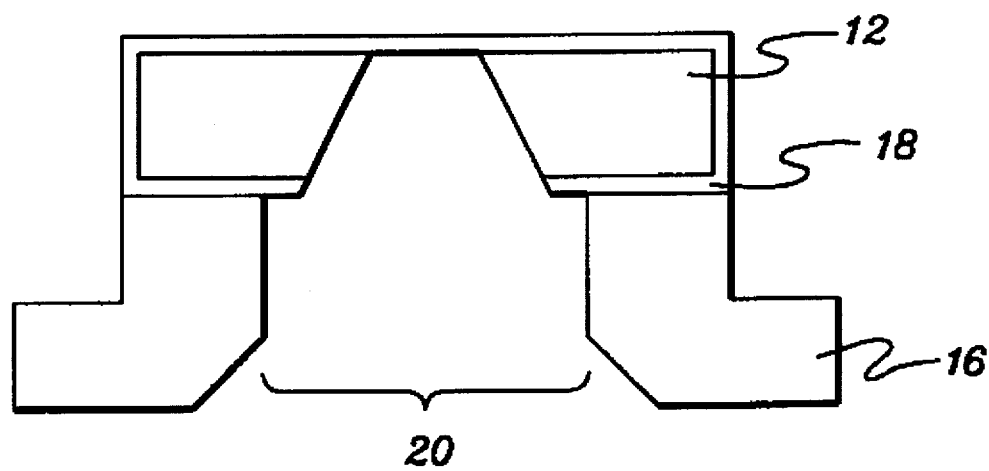
FIG. 3 is a cross section of a conventional X-ray mask.

In semiconductor X-ray mask manufacturing, the industry currently uses the structure shown in FIG. 3 as a cross section of a conventional X-ray mask. The bottom surface of membrane material film 18 on the wafer substrate 12 is anodically bonded to glass support 16. By contrast, FIG. 4 which shows an X-ray mask cross section according to the preferred embodiment of the present invention includes metal interlayer 14 interposed between membrane material 18 disposed on wafer substrate 12, and glass device 16.

Metal interlayer 14 comprises an easily oxidizable metal capable of anodically bonding to glass device 16. In addition, the metal used to form metal interlayer 14 must adhere well to membrane material film 18 or substrate 12 and must be easily removable from glass device 16 to which it is anodically bonded such that the removal doesn't damage the glass. Generally, the metal used is reactive with corrosive chemicals to which glass device 16 is chemically inert, while at the same time, the metal is resistant to chemical reaction during processing of the substrate. Examples of metals that may be used to form metal interlayer 14 include, but are not limited to, chromium, aluminum, hafnium, nickel, and iron.

Glass device 16 used in the structure of the present invention may be comprised of any glass which anodically bonds to metal interlayer 14. The glass used should have a thermal expansion coefficient closely matched to that of the substrate 12 material to which it is anodically bonded in order to prevent stressing between the materials upon heating and cooling which would break the anodic bond. In semiconductor mask manufacturing, the glass is preferably any sodium-containing borosilicate glass such as Corning 7740 Pyrex™ or its equivalent because its thermal expansion coefficient closely matches that of silicon. In addition, sodium-containing borosilicate glass is resistant to chemical attack. As shown in FIGS. 3 and 4, the configuration of glass device 16 in semiconductor X-ray mask fabrication used to support wafer substrate 12 and membrane film 18 is typically in the shape of a ring with an aperture 20 in the center thereof.

The method for removing and recovering an anodically bonded glass device 16 from substrate 12 in accordance with the present invention includes forming the above-mentioned structure. In semiconductor mask manufacturing, for example, the silicon wafer substrate 12 is coated with membrane material film 18 using conventional techniques including, but not limited to, chemical vapor deposition, diffusion, sputtering, or evaporation.

Metal interlayer 14 is deposited onto membrane material film 18 where one is formed (FIGS. 2 and 4), or directly onto substrate 12 (FIG. 1) using conventional techniques such as evaporation or sputtering, for example. Areas of membrane material film 18 or substrate 12 can be protected against unwanted deposition of metal interlayer 14 by using a physical mask to cover such areas, or the deposited interlayer 14 may later be removed by etching the metal from the areas. Glass device 16 is then anodically bonded to metal interlayer 14 using known methods at appropriate temperatures and voltages.

Removal and recovery of glass device 16 from the structure of the present invention generally comprises chemically or mechanically removing substrate 12 and membrane material film 18 from metal interlayer 14, followed by the removal of metal interlayer 14 using a corrosive chemical solution to which glass device 16 is chemically inert.

In the preferred embodiment, such as that used in semiconductor X-ray mask manufacture and shown in FIG. 4, membrane material 18 on top surface 22 of silicon wafer substrate 12 along with the bulk of silicon wafer 12 may be removed mechanically using commonly known methods such as polishing or grinding. In addition, where glass support 16 is in the shape of a ring, the center of the wafer that is not supported by the ring may also be removed by grinding or polishing. The remaining thickness of silicon wafer substrate 12 can then be removed chemically using known liquid silicon etchants which do not react with underlying glass support ring 16. For example, solutions of ethylenediamine/pyrocatechol/water or ethanolamine/gallic acid/water may be used to remove the remaining silicon.

Preferably, as in semiconductor masks and shown in FIG. 4, for example, the bottom surface membrane material film 18 is removed from metal interlayer 14 using selective reactive ion etching (RIE) techniques. The membrane material film 18 is typically RIE etchable, which makes RIE a particularly good method for its removal. RIE chemistry should be chosen that will etch the particular membrane at a high rate. For example, where an X-ray permeable membrane adhered to the metal interlayer is carbon (diamond), oxygen-based RIE chemistry may be employed to etch the membrane. Fluorine-based RIE chemistry is generally used to remove other X-ray permeable membranes such as boron-doped silicon, silicon carbide, or silicon nitride.

In addition, when RIE is employed to remove membrane material film 18, underlying metal interlayer 14 must be resistant to RIE to avoid damaging underlying glass device 16, which is susceptible to RIE damage. Thus, metal interlayer 14 acts as an etch stop for the chosen RIE chemistry to prevent etching the glass. The interlayer metals listed above are suitable etch stop materials and may be used to form the metal interlayer 14 in conjunction with the method of RIE to remove membrane material film 18. However, the method of the present invention is not limited to the use of a metal interlayer 14 that is resistant to RIE, and any chemical or mechanical means for removing the material adhering to the metal interlayer 14 and the metal interlayer 14 itself may be used so long as such method does not damage the underlying glass device 16.

The remaining metal interlayer 14 bonded to glass device 16 is removed from the glass using a corrosive chemical solution to which the underlying glass is chemically inert. For example, solutions of ceric ammonium nitrate or fuming sulfuric acid are chemicals known to react with oxidizable metals leaving sodium-containing borosilicate glass unaffected. However, the invention is not limited to the use of the aforementioned corrosive chemicals, and additional corrosive chemicals that may be used to remove metal interlayer 14 will be obvious to those skilled in the art.

While the invention has been particularly shown and described with reference to preferred embodiments thereof, it will be understood by those skilled in the art that other changes in form and details may be made therein without departing from the spirit and scope of the invention.

We claim:

1. A method allowing the recovery of a glass device comprising the steps of:

a) anodically bonding a glass device to an oxidizable metal interlayer overlying a substrate;

(b) removing said substrate from said metal interlayer; and (c) removing said metal interlayer from said glass device by contacting said metal interlayer with a chemical which corrodes said metal interlayer and toward which said glass device is chemically inert.

2. The method according to claim 1, wherein said metal interlayer is a layer of metal selected from the group consisting of aluminum, chromium, hafnium, nickel, and iron.

3. The method according to claim 1, wherein said chemical which corrodes said metal interlayer is selected from the group consisting of ceric ammonium nitrate and fuming sulfuric acid.

4. The method according to claim 1, wherein said glass device comprises a sodium-containing borosilicate glass device.

5. The method according to claim 1, wherein step (b) comprises the method of selective reactive ion etching.

6. The method according to claim 1, wherein said substrate comprises a body selected from the group consisting of silicon, silicon oxide, silicon nitride, and silicon carbide.

7. The method according to claim 1, wherein said substrate comprises:

(a) silicon; and (b) a membrane material film interposed between said silicon and said metal interlayer.

8. The method according to claim 7, wherein said membrane material film comprises a material selected from the group consisting of membrane materials that are permeable to X-rays, permeable to electrons, opaque to electrons, and opaque to ions.

9. The method according to claim 7, wherein said membrane material film comprises a material selected from the group consisting of boron-doped silicon, silicon carbide, silicon nitride, carbon (diamond), boron nitride, beryllium, and polysilicon.

* * * * *